(12) United States Patent
Broome

(10) Patent No.: US 6,516,954 B2
(45) Date of Patent: Feb. 11, 2003

(54) EQUIPMENT RACK WITH INTEGRAL HVAC AND POWER DISTRIBUTION FEATURES

(75) Inventor: John P. Broome, Arlington, VA (US)

(73) Assignee: ServerVault Corp., Sterling, VA (US)

( * ) Notice: Subject to any disclaimer, the term of this patent is extended or adjusted under 35 U.S.C. 154(b) by 0 days.

(21) Appl. No.: 09/893,517

(22) Filed: Jun. 29, 2001

(65) Prior Publication Data

US 2002/0020682 A1 Feb. 21, 2002

Related U.S. Application Data

(60) Provisional application No. 60/214,751, filed on Jun. 29, 2000.

(51) Int. Cl.$^7$ ................................................. A47F 7/00
(52) U.S. Cl. ........................................................ 211/26
(58) Field of Search ............................... 211/26, 133.6; 165/104.33, 122

(56) References Cited

U.S. PATENT DOCUMENTS

| | | |
|---|---|---|
| 2,948,518 A | 8/1960 | Kraus |
| 3,187,082 A | 6/1965 | Allison |
| 3,192,306 A | 6/1965 | Skonnord |
| 3,226,602 A | 12/1965 | Elfving |
| 3,268,772 A | 8/1966 | Kamei et al. |
| 4,089,040 A | 5/1978 | Paulsen |
| 4,277,815 A | 7/1981 | Skroupa |
| 4,505,394 A * | 3/1985 | Reimer ............................ 108/5 |
| 4,536,824 A | 8/1985 | Barrett et al. |
| 4,672,509 A * | 6/1987 | Speraw ........................ 165/122 |
| 4,793,405 A | 12/1988 | Diggelmann et al. |
| 4,935,845 A | 6/1990 | Schwehr et al. |
| 5,142,445 A | 8/1992 | Sorensen |
| 5,218,513 A | 6/1993 | Brown |
| 5,270,572 A | 12/1993 | Nakajima et al. |
| 5,329,425 A | 7/1994 | Leyssens et al. |
| 5,371,653 A | 12/1994 | Kametani et al. |
| 5,424,916 A | 6/1995 | Martin |
| 5,493,474 A | 2/1996 | Schkrohowsky et al. |
| 5,555,640 A * | 9/1996 | Ou ............................ 211/133.6 |
| 5,570,740 A | 11/1996 | Flores et al. |
| 5,663,868 A | 9/1997 | Stalley |
| 5,705,854 A | 1/1998 | Atarashi et al. |
| 5,844,777 A | 12/1998 | Gates |
| 5,940,288 A | 8/1999 | Kociecki |
| 5,953,930 A | 9/1999 | Chu et al. |
| 6,052,282 A * | 4/2000 | Sugiyama et al. ...... 165/104.33 |
| 6,055,157 A | 4/2000 | Bartilson |
| 6,085,854 A * | 7/2000 | Nishikawa .................. 180/68.5 |

* cited by examiner

Primary Examiner—Alvin Chin-Shue
Assistant Examiner—Sarah Purol
(74) Attorney, Agent, or Firm—Nixon & Vanderhye P.C.

(57) ABSTRACT

A rack element for mounting electronic equipment thereon, including: a front portion, a rear portion, and a pair of side portions defining an interior of the rack element therebetween. The interior of the rack element is partitioned into a front section and rear section, wherein the front section defines an air duct and the rear section defines a power distribution section. The air duct has an opening at one end thereof for receiving cooling air from an air conditioning system, and the front portion of the rack element includes a plurality of openings therein for enabling the cooling air from the duct to exit therethrough for cooling equipment mounted therein. The power distribution section includes an opening at one end thereof for enabling power cables to enter the power distribution section for powering equipment when mounted on the rack element.

14 Claims, 13 Drawing Sheets

EQUIPMENT RACK WITH INTEGRAL HVAC AND POWER DISTRIBUTION FEATURES

CROSS-REFERENCES TO RELATED APPLICATIONS

This application hereby claims priority on U.S. provisional application serial No. 60/214,751 filed Jun. 29, 2000, and entitled "Racks with Integrated Heating, Ventilation, and Air Conditioning (HVAC) Ducting".

This application is related to co-pending patent application Ser. No. 09/894877 file concurrently herewith and entitled "Equipment Rack Accessory for Improving Equipment Mounting", the disclosure of which is incorporated by reference herein in its entirety.

FIELD OF THE INVENTION

The instant invention relates to electronic equipment racks and, more particularly, to an improved equipment rack for use in data centers and the like that includes integrated cooling ducts and power distribution features. The invention has particular applicability to telecommunications equipment racks and cabinets constructed in accordance with the EIA/TIA standard EIA-310-D ("cabinets, Racks, Panels and Associated Equipment" (ANSI/EIA/310-D-92)).

BACKGROUND AND SUMMARY OF THE INVENTION

Equipment racks and cabinets are used extensively in data communication facilities and the like for the purpose of enabling electronic equipment to be mounted therein. Such racks typically include a rack face which enables the equipment to be mounted such that a bracket on the front of the equipment is secured, using fasteners or the like, to the front face of the rack.

Data center processing equipment, such as telecommunications equipment, Web servers and the like, are typically mounted in a series of such racks or cabinets within the data center. Such equipment also typically draws air in through the front of the equipment for cooling purposes. Data center processing equipment has been getting smaller over the years. For example, machines with the same amount of computing power that used to measure six or more inches in height are now contained in 1.75 inches.

The size and shape of such processing equipment has become fairly standardized. The structure of racks and cabinets for use in mounting the processing equipment has also become fairly standardized in several respects. For example, in traditional computer rooms and data communication facilities, racks are typically provided that have the following common characteristics:

19 inch or 23 inch width (nominal);

2 rail or four post designs;

varying depth of 4 post racks or cabinets; and mounting systems to accommodate equipment in height multiples of 1.75 inches (one "rack unit"), typically pre-drilled and tapped holes for screw-mounting equipment.

These common characteristics are defined in EIA/TIA standard EIA-310-D ("cabinets, Racks, Panels and Associated Equipment" (ANSI/EIA/310-D-92)).

In view of this accepted standard for racks, cabinets and equipment, there are a substantial number of processing machines, such as servers for use in connection with the Internet, that are 1.75 inches in height. Such equipment is known as "1U equipment". In conventional rack mounting systems, 1.75 inches is known as "one rack unit", or the smallest unit of measure for equipment mounting locations within the vertical space of one data rack. This height (1U) corresponds to the standard mounting distance in EIA-spec telecommunications racks, and is the smallest unit of measure when discussing data center footprint of computing machines.

EIA-spec telecommunications racks and the like include predefined screw or bolt holes in the frame of the rack for enabling 1U equipment to be mounted thereon in a stacked manner. The mounting holes in such EIA-spec racks are positioned such that, when mounted, each piece of equipment is in contact, or very close to being in contact, with adjacent pieces of equipment. In other words, such EIA-spec racks are designed such that there is substantially no space between each piece of equipment.

There are several problems associate with the use of EIA-spec telecommunications racks, and other similar racks. For example, when 1U equipment is mounted vertically with no space between adjacent pieces of equipment, there is a substantial amount of heat conducted up the stack of equipment from one machine to another. This phenomenon is known as the "chimney effect." Most of this heat energy is conducted up through the stacked equipment due to the proximity of the equipment cases (touching or very nearly touching). As a result, data centers that house such racks must constantly provide sufficient cooling for the equipment to prevent damage or malfunction of the equipment due to this excess heat. However, the design of typical racks and cabinets do not facilitate easy cooling of the equipment when densely mounted in rack or cabinets. While racks with integral cooling ducts have been provided in the past for certain application, such prior art racks have not been suitable or convenient for use in communications facilities having a large number of pieces of 1U equipment or the like. In addition, such prior art racks have not facilitated easy, efficient and convenient power distribution between various pieces of equipment and between various racks. As a result, power cables and the like are often not provided in a neat, orderly and secure fashion and, as a result, accidental power loss can result.

Equipment density in telecommunications closets, telephone switch sites, and data centers is increasing rapidly. As the equipment density increases, so do the power and cooling requirements. It is very difficult to distribute cool air effectively to all of the equipment in a densely populated data center. It is also difficult to distribute power to all of the equipment in a neat, orderly and efficient manner.

Thus, a need exists for an improved racking system that improves cooling and power distribution for equipment mounted therein. The present invention addressed this need by providing a racking system that allows for even distribution of cool air to all equipment without the need for intrusive duct-work or other common spot-cooling solutions by combining the rack and HVAC ducting footprint into the footprint previously occupied by only the conventional rack mounting system. The racking system of the present invention also simplifies power distribution between the equipment in a rack and between adjacent racks.

In accordance with a main aspect of the instant invention, a rack element is provided for use in connection with mounting of electronic equipment. The rack element includes a front portion, a rear portion, and a pair of side portions defining an interior of the rack element therebetween. The interior of the rack element is partitioned into a front section and a rear section, wherein the front section defines an air duct and the rear section defines a power distribution section. The air duct has an opening at one end thereof for receiving cooling air from an air conditioning system, and the front portion of the rack element includes a plurality of openings therein for enabling the cooling air from the duct to exit therethrough for cooling equipment mounted thereon. The power distribution section includes an opening at one end thereof for enabling power cables to enter the power distribution section for powering equipment when mounted on the rack element.

In accordance with another aspect of the invention, the plurality of openings on the front portion of the rack element are substantially equally spaced along substantially the entire front portion of the rack. In addition, the rear portion of the rack preferably includes openings that enable power distribution elements to be inserted into the power distribution section of the rack element.

In accordance with a further aspect of the invention, the rack element is configured for use in connection with EIA-spec rack systems and equipment that is one rack unit (1U) in height.

In accordance with another aspect of the invention, the rack element further includes at least one opening in each of the pair of side portions for enabling mounted equipment power cords to be passed therethrough and into the power distribution section of the rack element. In addition, the rack element preferably includes a second opening in each of the pair of side portions of the rack element for providing a rear mount location in the power distribution section for mounting side-venting equipment.

In accordance with a further aspect of the invention, the rack element includes a third opening in each of the pair of side portions of the rack element adjacent a lower end thereof which defines a power distribution channel for distributing power from one rack element to another similar rack element.

The rack element is constructed and arranged such that a pair of the rack elements define a complete rack system that can be used to mount equipment thereon.

BRIEF DESCRIPTION OF THE DRAWINGS

These and other objects, feature and advantages of the instant invention will become apparent from the following detailed description of the invention when read in conjunction with the appended drawings, in which.

DETAILED DESCRIPTION OF THE PREFERRED EMBODIMENTS

The preferred embodiment of the instant invention will now be described with reference to the appended drawings. The preferred embodiments described herein and shown in the drawings are only exemplary and are not meant to limit the invention to the specific form and configuration thereof other than as set forth in the claims.

Figure 1:
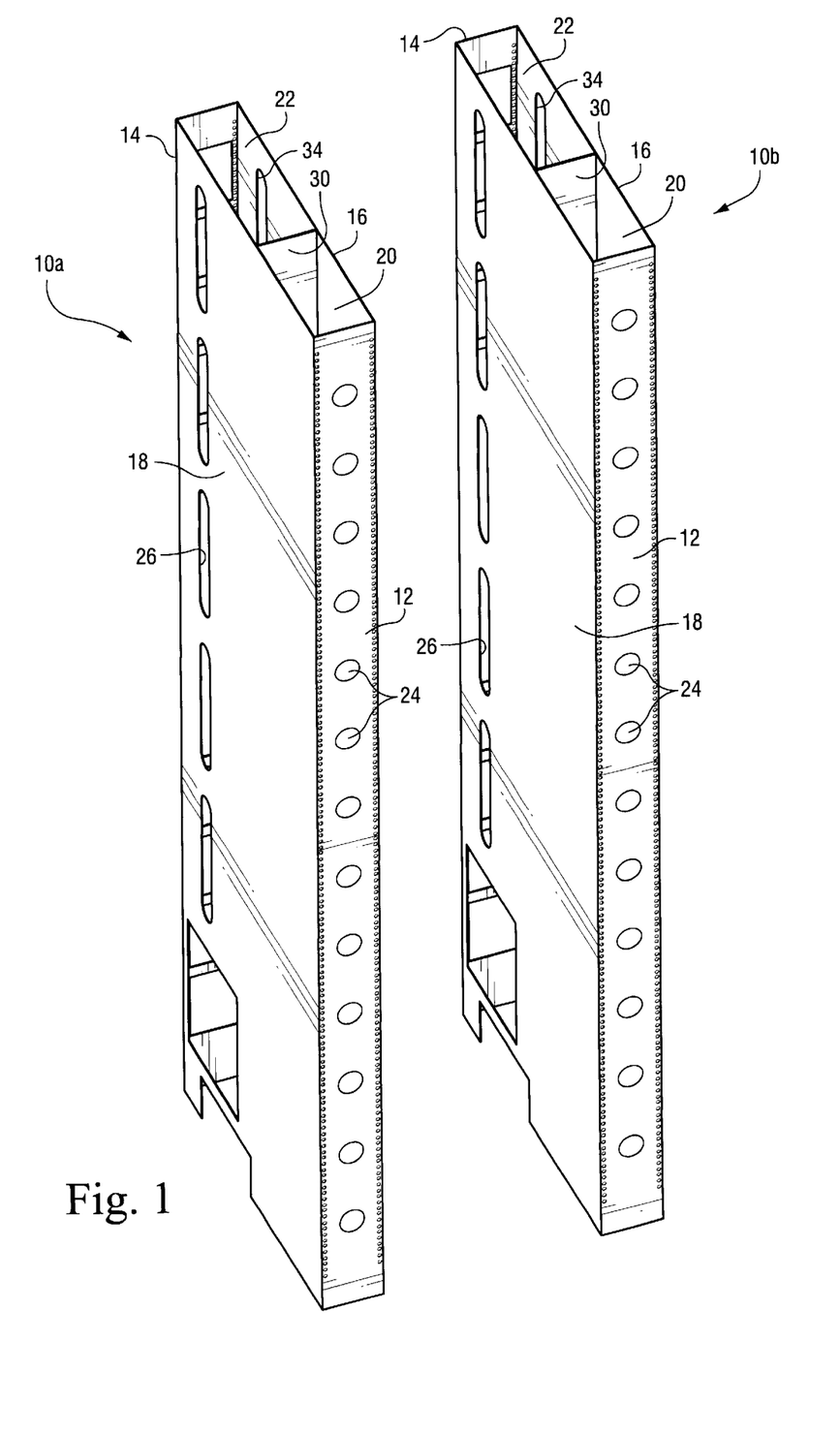
FIG. 1 is a front perspective view of a pair of rack elements constructed in accordance with a preferred embodiment of the instant invention.

FIG. 1 shows a pair of rack elements 10a and 10b constructed in accordance with a preferred embodiment of the instant invention, and together constituting a complete rack system for mounting equipment thereon. Each of the rack elements (10a and 10b) include a front portion 12 and rear portion 14 and a pair of side portions 16 and 18. The front, rear and pair of side portions are generally configured in the shape of a rectangular box and define an interior of the rack element therebetween. In accordance with the invention, the interior of the rack element is partitioned by, for example, wall 30 into two interior sections 20 and 22.

The front interior section 20 of the rack element defines an air duct having an open end at the top and/or bottom for receiving cooling air for cooling equipment that is mounted on the rack element. In the preferred embodiment, the top part of the air duct has an opening for use in connecting the air duct 20 to an air conditioning system. The front portion 12 of the rack element includes a series of holes or openings 24 therein for enabling the cooling air introduced into the air duct 20 to exit therethrough for the purpose of distributing the cooling air across the front of the rack element for cooling equipment mounted thereon. As shown in FIG. 1, the air flow openings 24 are preferably equally spaced and exist along the entire length of the front portion 12, thereby evenly distributing the cooling air to the entire front area of the rack elements 10a and 10b.

The rear interior section 22 defines a power distribution section that is configured to enable convenient power distribution to equipment that is mounted on the rack element and for distributing power between adjacent rack elements when installed in a data center. The power distribution section 22 has an open top portion for enabling power cables or lines to be run into this section of the rack element. As will be explained in greater detail below, the rear or power distribution section 22 of the rack element enables power strips and/or other similar connectors to be conveniently inserted and housed therein for use in connecting power cords for mounted equipment thereto. For this purpose, the back portion 14 of the rack element preferably has openings therein for access to the power distribution section 22. The rack portion includes various other openings (e.g., openings 34) into the power distribution section 22 for performing various power distribution and other functions, as will be described in detail below.

Figure 2:
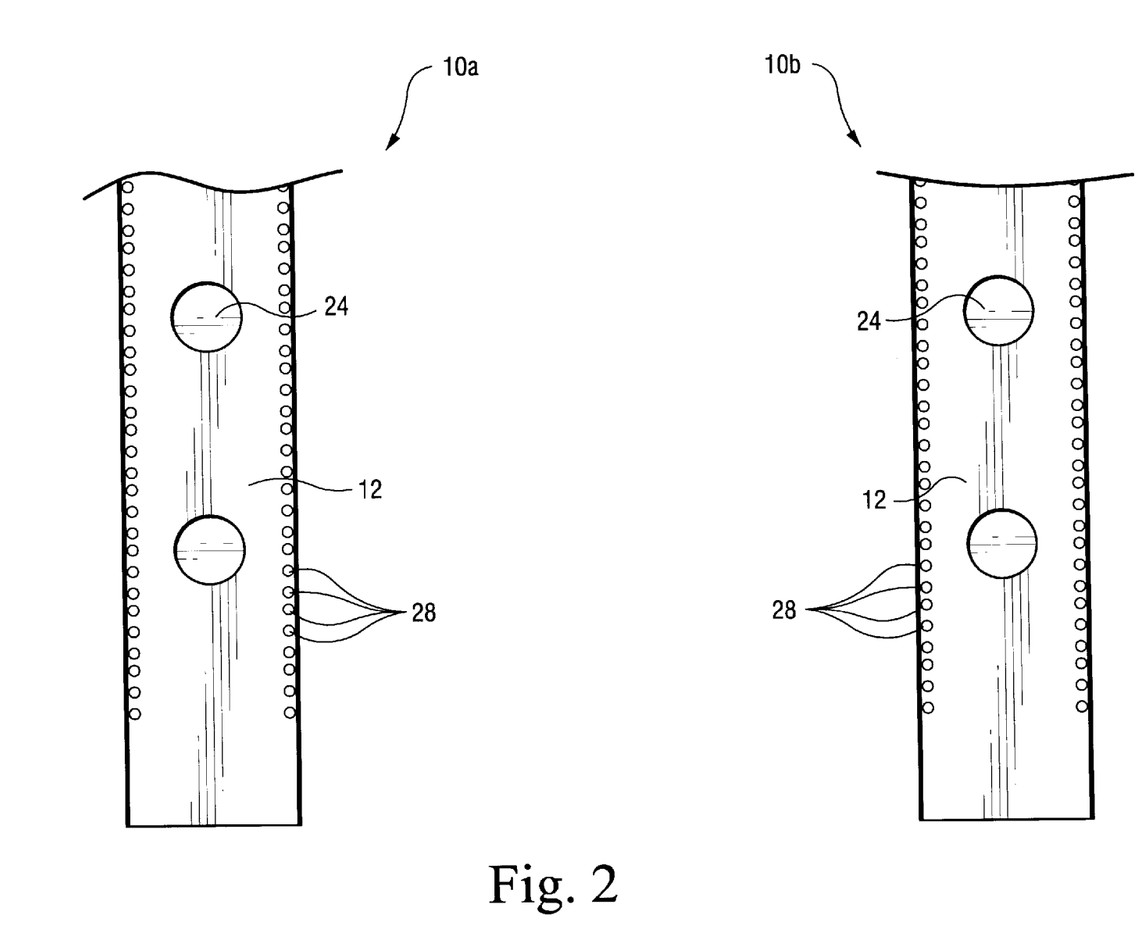
FIG. 2 is a partial front view of the pair of rack elements of FIG. 1.
Figure 3:
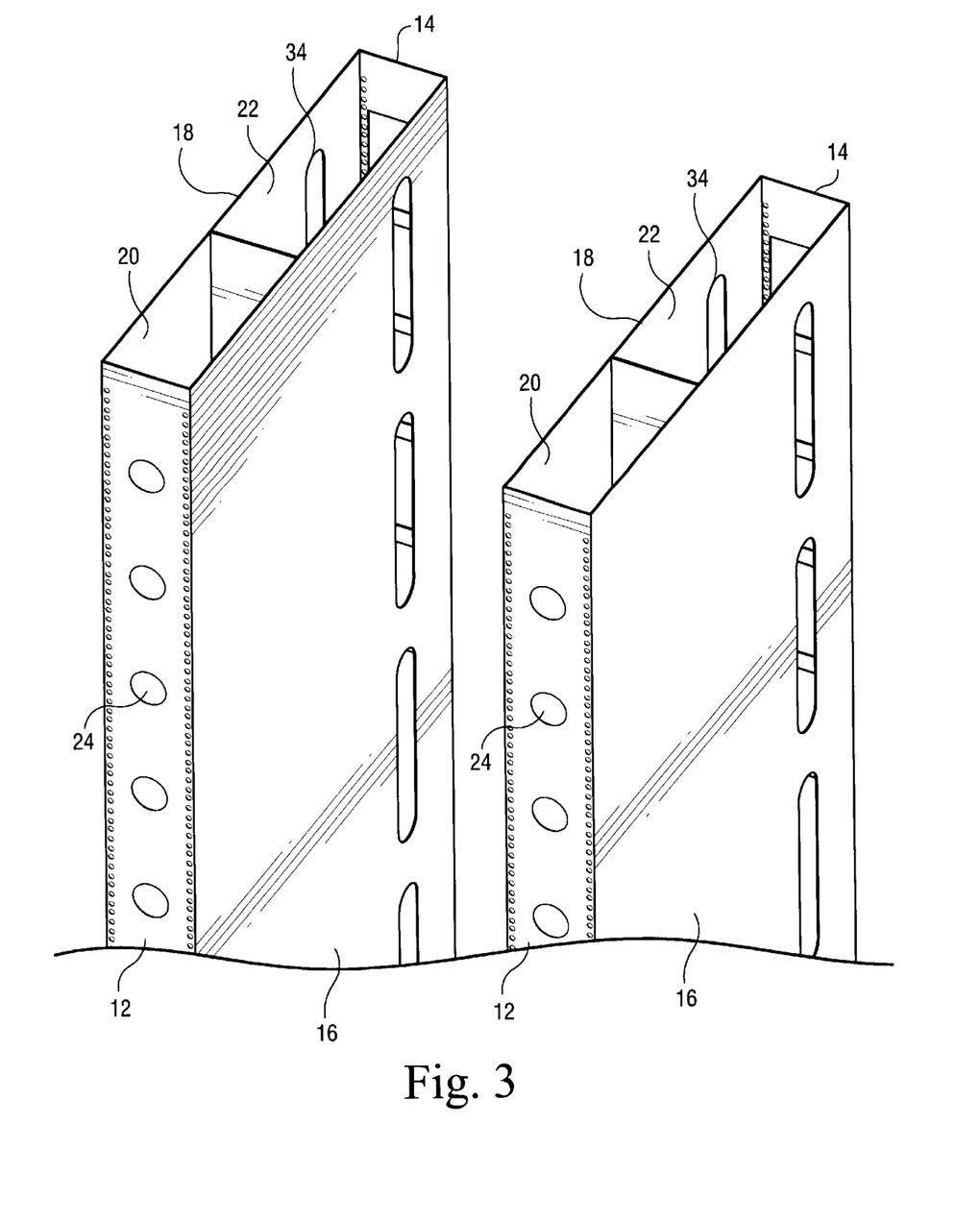
FIG. 3 is a partial top perspective view of the pair of rack elements of FIG. 1.

FIG. 2 shows an enlarged partial view of the front portions 12 of the rack elements 10a and 10b. As can be seen in FIG. 2, the front portions 12 of the rack elements 10a and 10b include pre-drilled and tapped holes for screw-mounting equipment thereon. These holes and the overall configuration of the front portion of the rack elements preferably correspond to the specifications defined in EIA/TIA standard EIA-310-D ("cabinets, Racks, Panels and Associated Equipment" (ANSI/EIA/310-D-92)), thereby enabling the rack elements to be used for mounting equipment that is one rack unit (1U) in height. FIG. 3 shows a partial front view of the upper portion of the rack elements 10a and 10b of FIG. 1.

Figure 4:
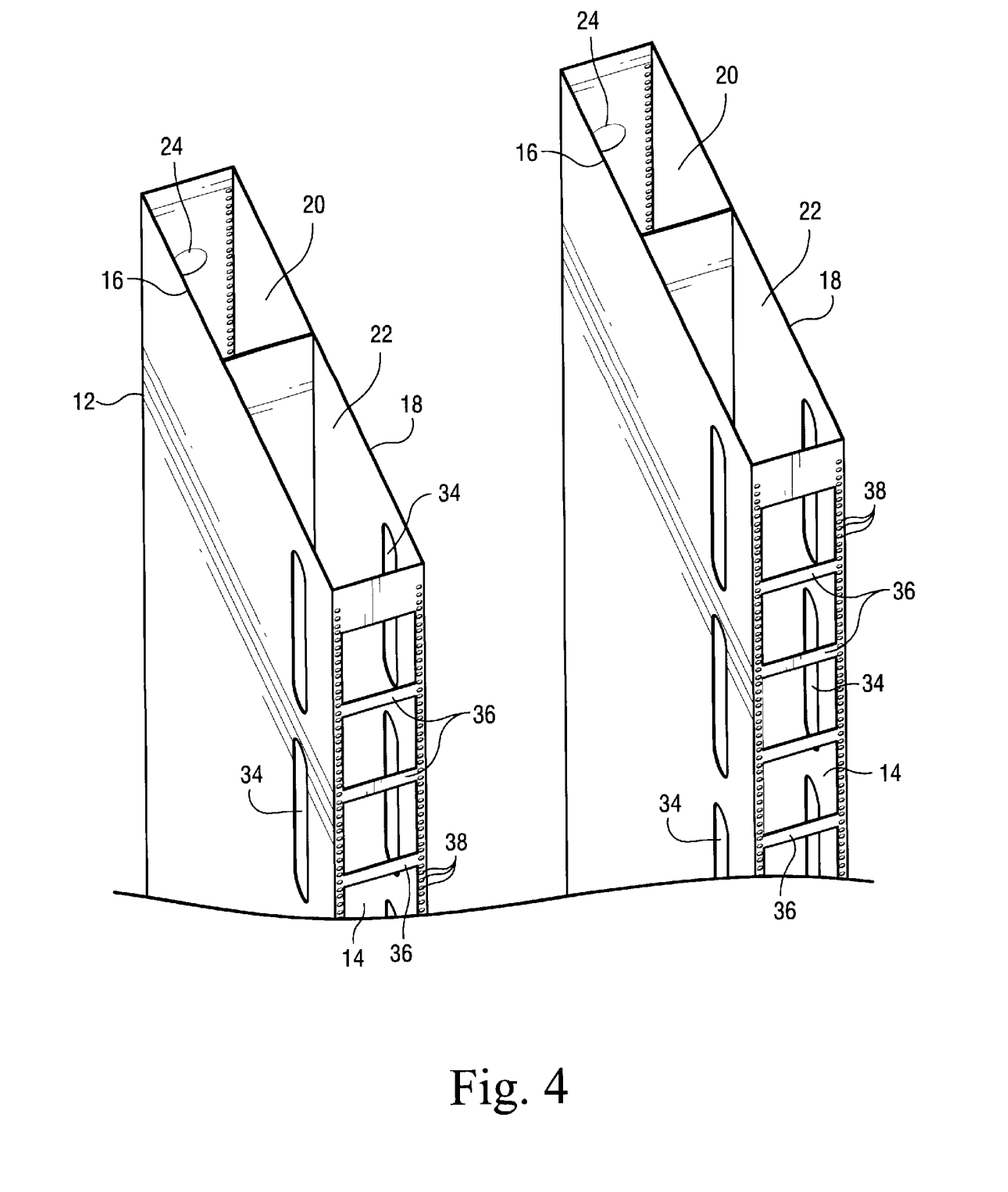
FIG. 4 is a rear perspective view of the pair of rack elements of FIG. 1.

FIG. 4 shows a partial rear view of the upper portion of the rack elements 10a and 10b of FIG. 1. As can be seen in FIG. 4, the rear portion preferably includes a series of bars 36 that define openings therebetween for enabling access to the power distribution section 22 for power distribution elements, such as power strips and the like. In other words, power strips can be inserted between the bars 36 and housed in the power distribution section 22 for use in connection with powering equipment mounted on the rack elements. At least one space is preferably provided that is larger than the other spaces between the bars 36 for enabling long power strips to be inserted therethrough in an easy and convenient manner. FIG. 4 also shows elongated openings 34 in each of the side portions for enabling power cords from equipment mounted on the rack to be inserted therethrough for connection with the power strips or other power connector housed in the power distribution section 22. The back portion 14 of the rack elements may also include screw holes 38, similar to the screw holes 28 of the front portion 12, for the purpose of enabling equipment to be secured to the rear portion as well as the front portion of the rack elements.

Figure 5:
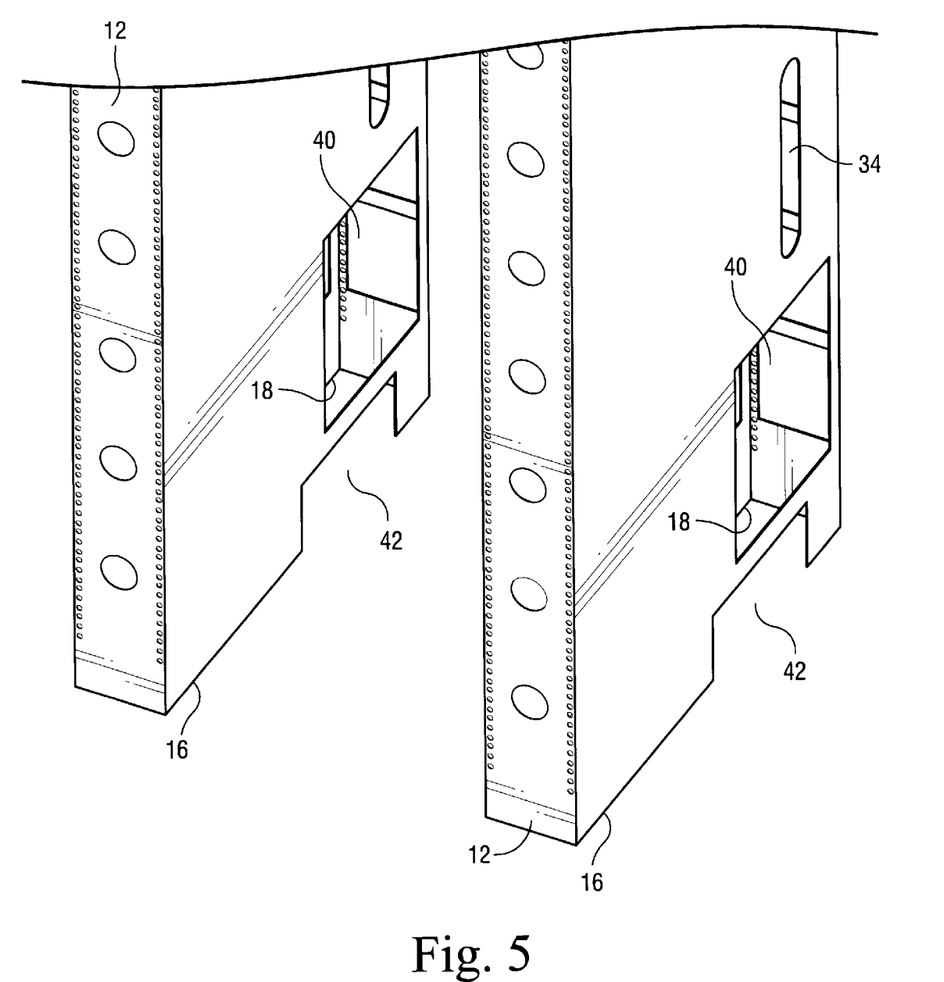
FIG. 5 is a front bottom perspective view of the pair of rack elements of FIG. 1.
Figure 6:
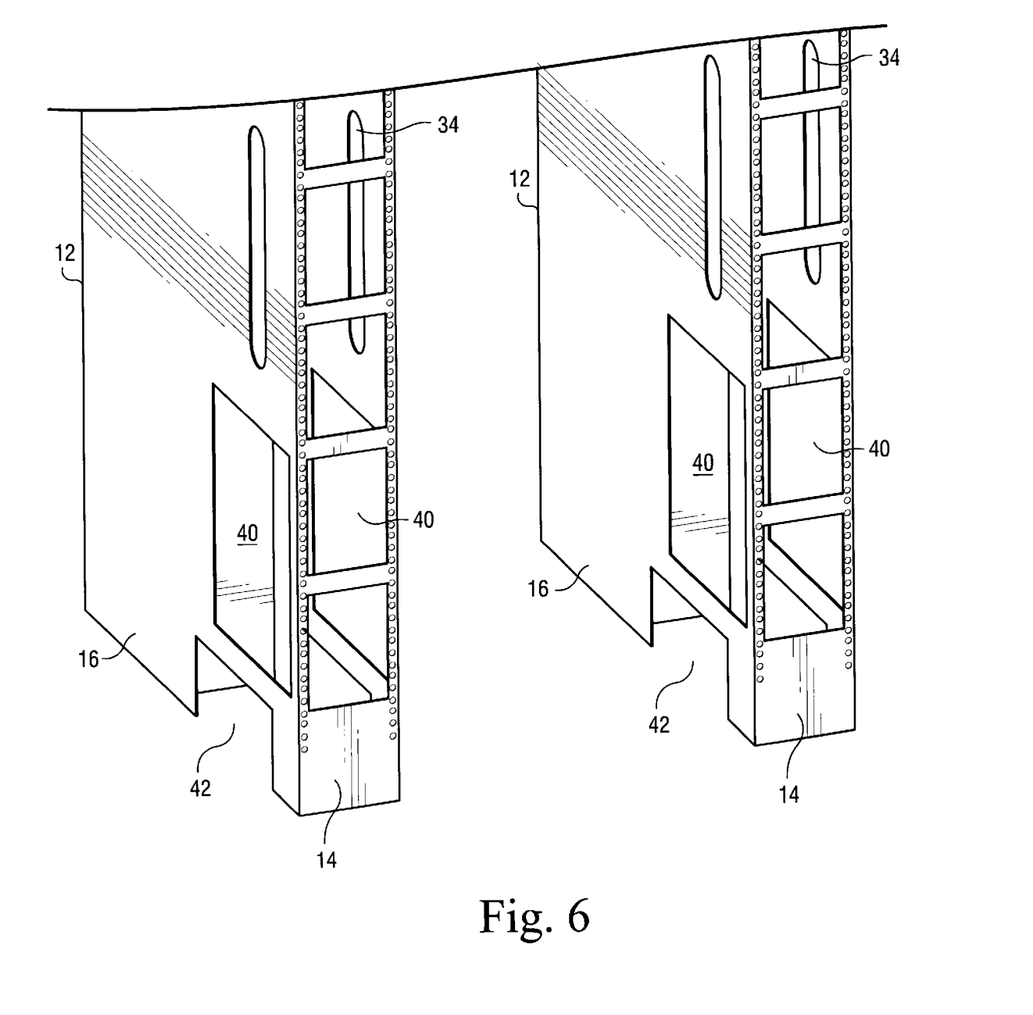
FIG. 6 is a rear bottom perspective view of the pair of rack elements of FIG. 1.

FIG. 5 shows a partial front view of the bottom portion of the rack elements 10a and 10b of FIG. 1. As can be seen in FIG. 5, the side portions 16 and 18 of the rack elements include, in addition to the elongated openings 34, two additional openings 40 and 42 near the lower end thereof. The opening or cut-out 42 is provided along the lower edge of the sides of the rack element in a manner that defines a power distribution channel for enabling power cables to be passed therethrough for distributing power from one rack element to adjacent rack elements. In other words, power cables can run out of the power distribution section 22 of the rack element through the channels defined by the openings 42. In addition, openings 40 are preferably provided on each of the side portions 16 and 18 of the rack elements for enabling side venting equipment to be rear mounted in the rack elements. FIG. 6 shows a rear view of the lower portion of the rack elements of FIG. 5.

Figure 7:
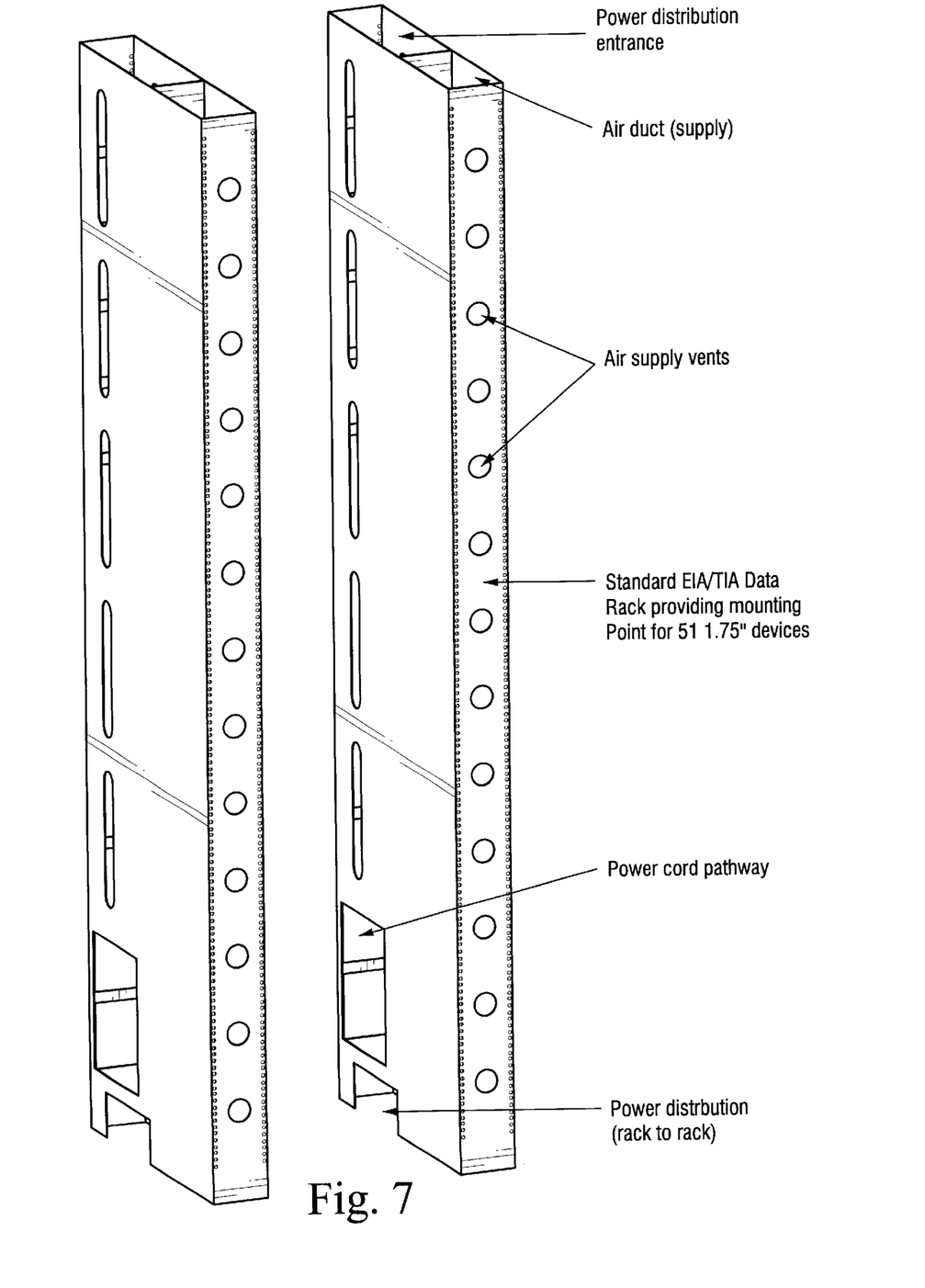
FIG. 7 shows another front perspective view of the pair of rack elements of FIG. 1.
Figure 8:
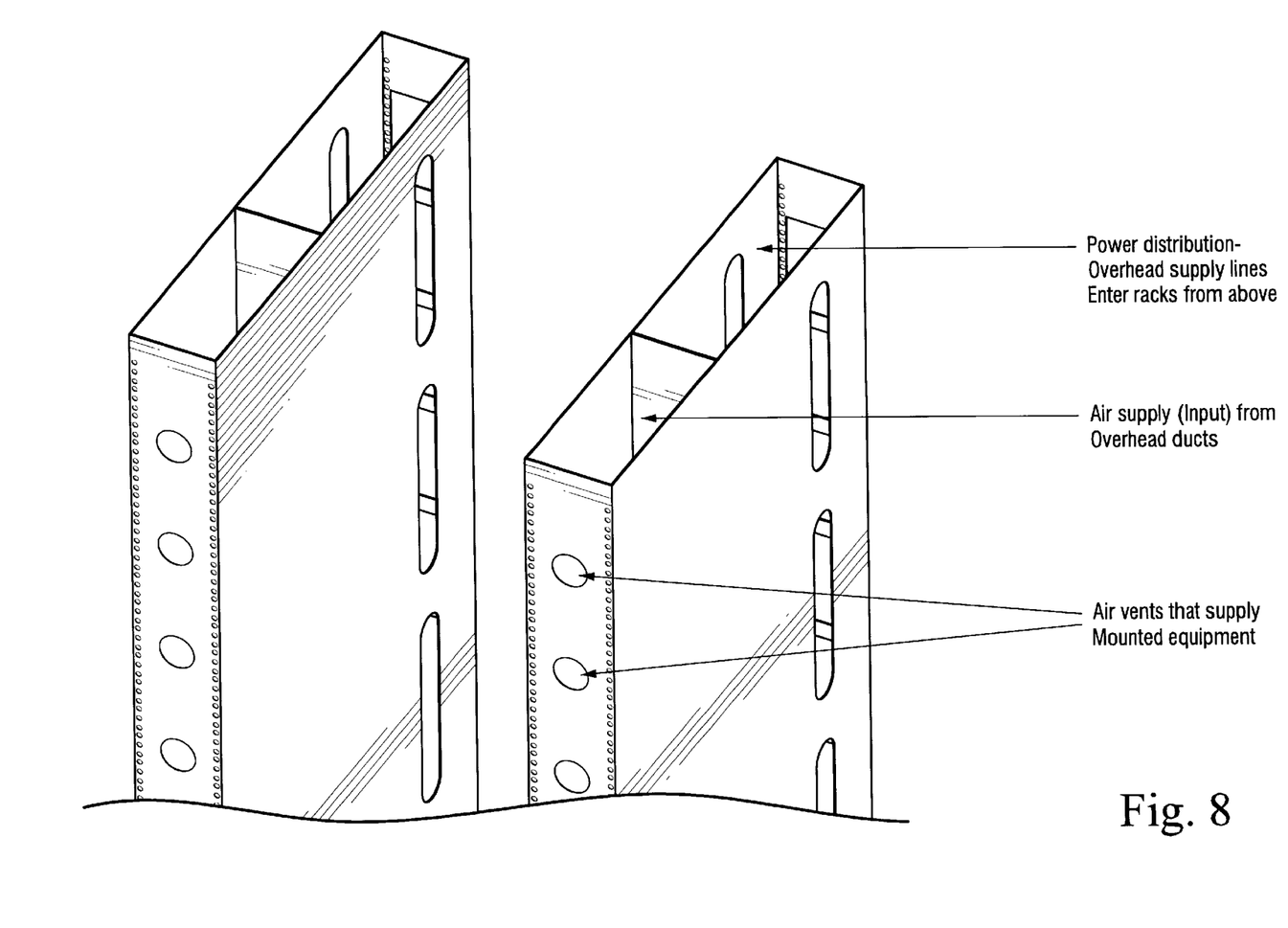
FIG. 8 shows a front top perspective view of the pair of rack elements of FIG. 7.
Figure 9:
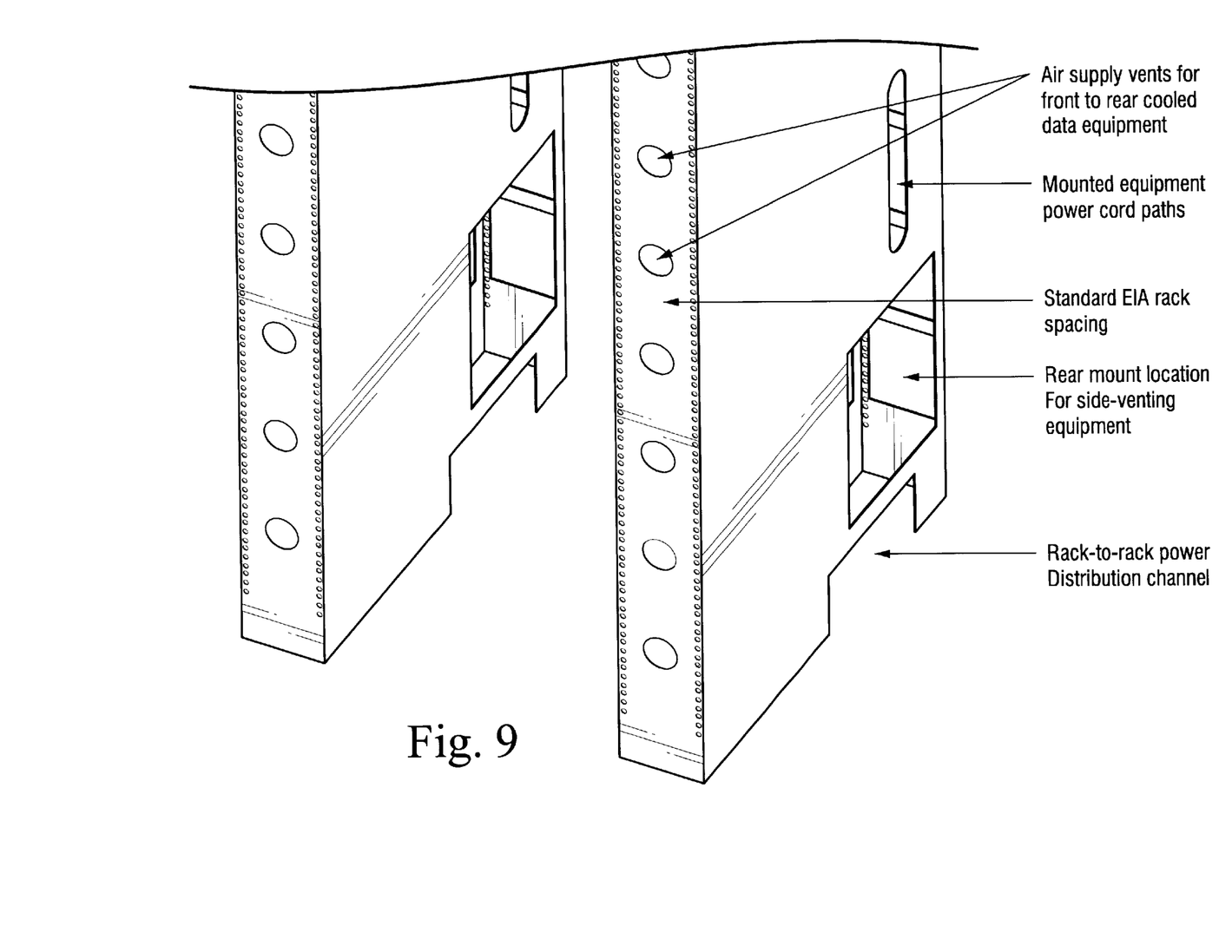
FIG. 9 shows a front bottom perspective view of the pair of rack elements of FIG. 7.
Figure 10:
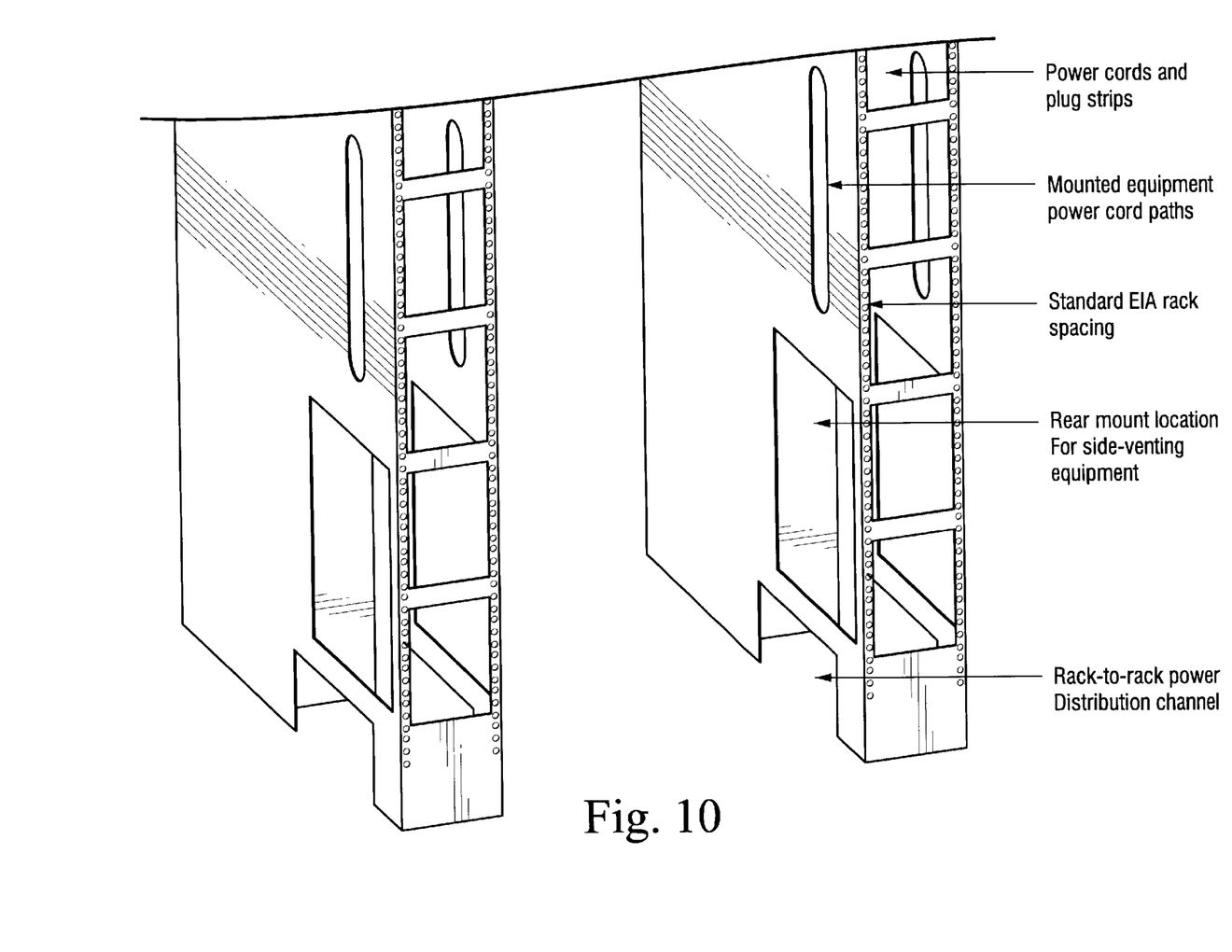
FIG. 10 shows a rear bottom perspective view of the pair of rack elements of FIG. 7.

FIG. 7 shows another view of a pair of rack elements constructed in accordance with the instant invention and corresponding to the rack elements of FIG. 1. FIG. 8 shows a view of the rack elements of FIG. 7 that substantially corresponds to FIG. 3. FIG. 9 shows a front view of the lower portion of the rack elements of FIG. 7 and corresponds substantially to FIG. 5. FIG. 10 shows a rear view of the lower portion of the rack elements of FIG. 7 and corresponds substantially to FIG. 6.

Figure 11:
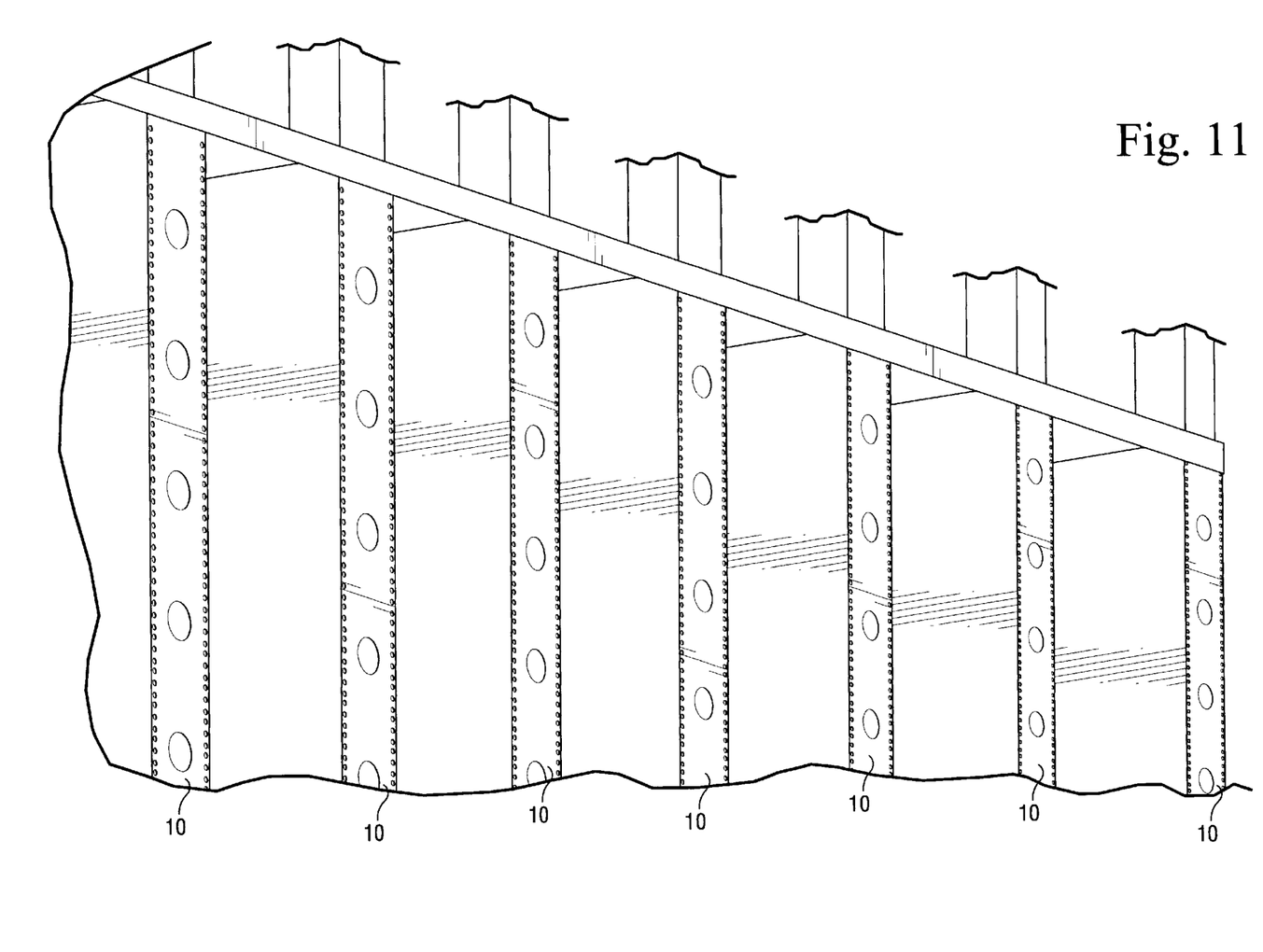
FIG. 11 shows a front/side view of a series of racks installed in a data center and connected to an air conditioning system, in accordance with a preferred embodiment of the instant invention.

FIG. 11 shows a view of a data center having numerous rack elements 10 of the present invention and described above installed therein and ready to have equipment mounted thereon. The top portion of each of the rack elements are connected to an overhead air conditioning system in a manner that enables cooling air to be supplied to the air ducts 20 of each of the rack elements.

Figure 12:
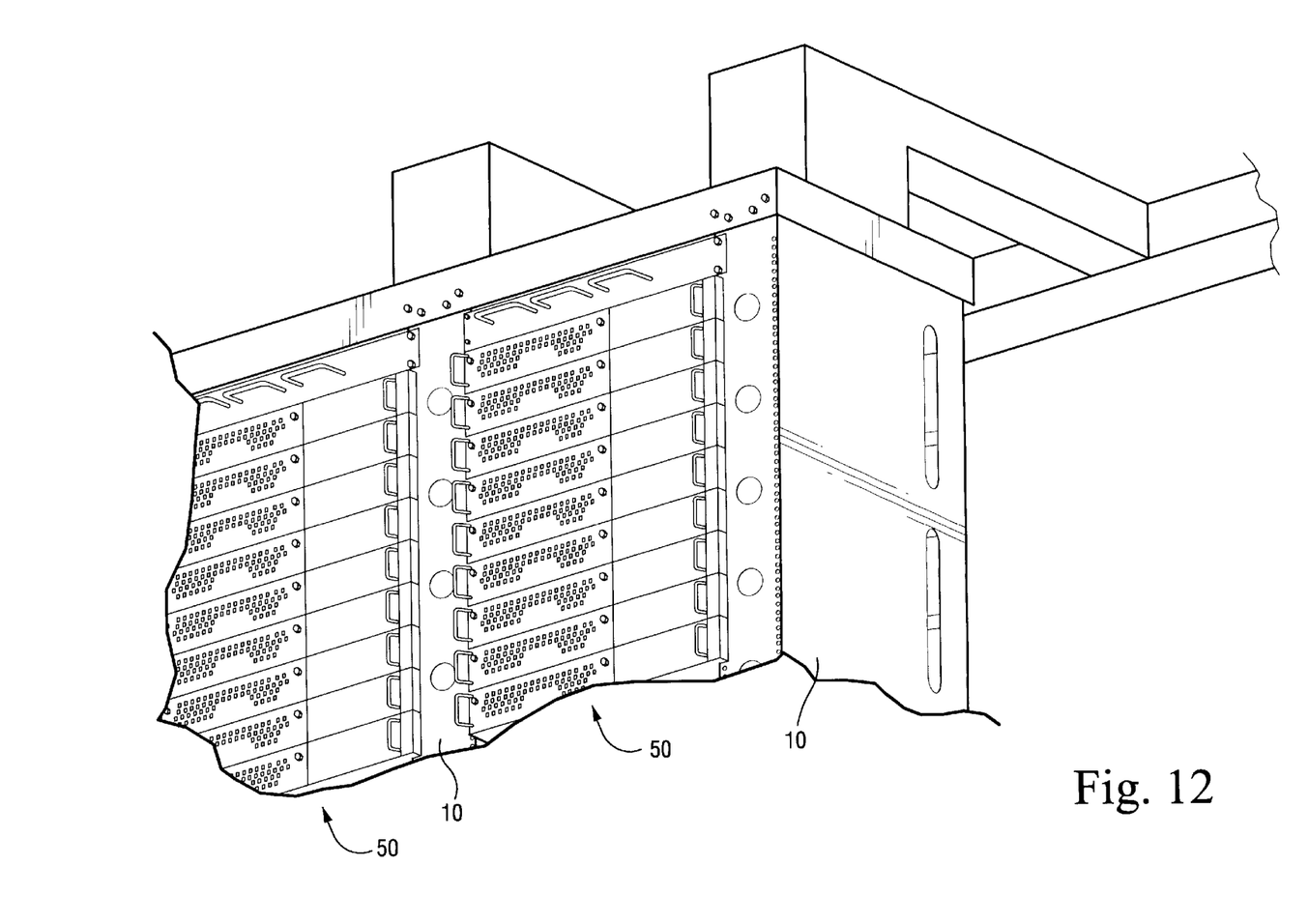
FIG. 12 shows a front/side view of a pair of racks constructed in accordance with preferred embodiment of the instant invention and having servers mounted therein.

FIG. 12 show a front view of a data center having the rack elements 10 of the present invention installed therein and having servers 50 installed in the racks. The holes 24 in the front portion of the rack elements direct air to the front of the row of rack elements, thereby providing evenly distributed cooling air to the servers which draw the cooling air through the front panel thereof for cooling purposes. The rack elements could be further enhanced with the addition of baffles and/or louvers on the air outlets or elsewhere to direct the air flow path as desired.

Figure 13:
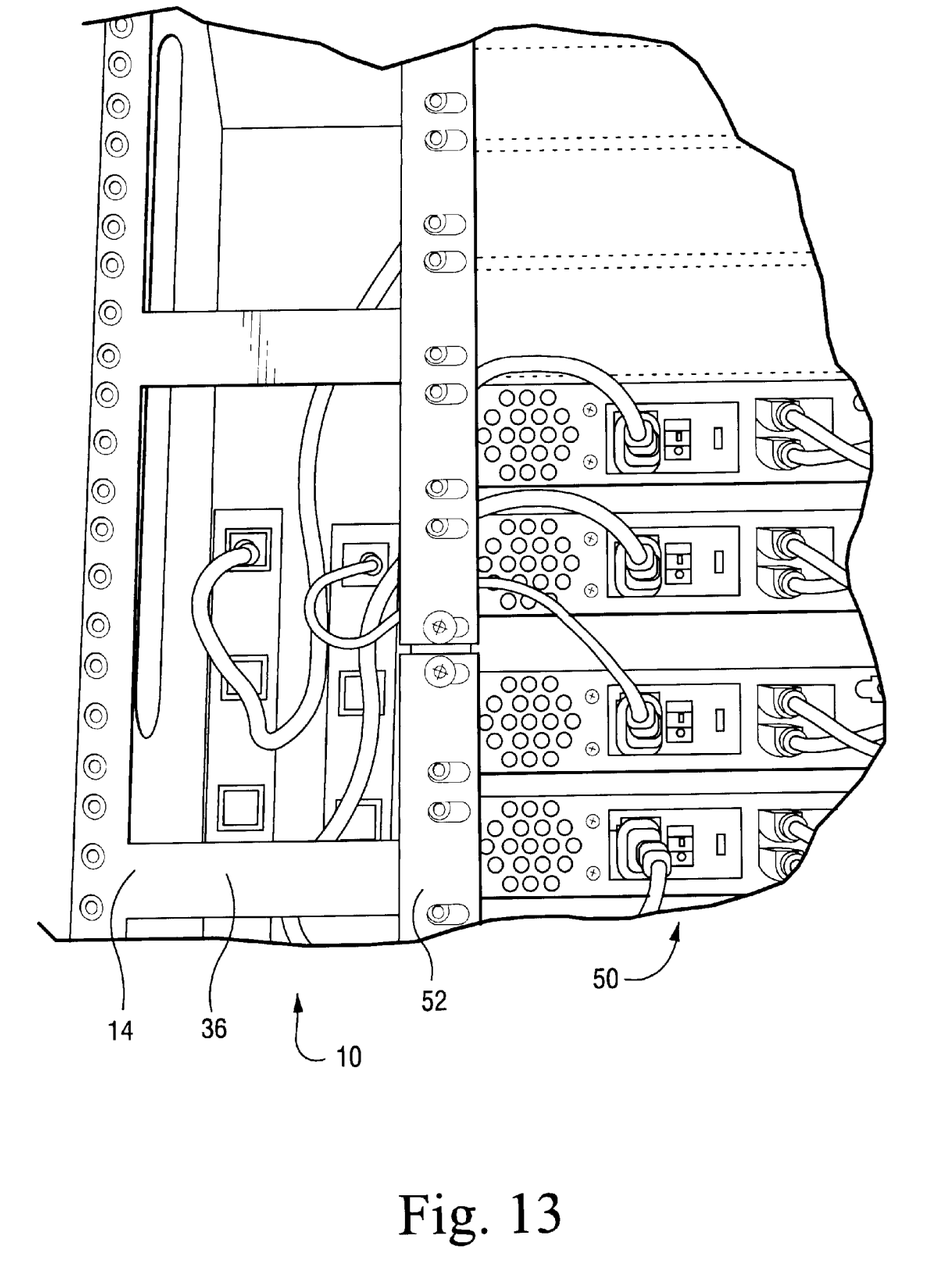
FIG. 13 shows a partial rear view of a section of the rack of FIG. 12 having servers mounted therein and showing the power distribution feature of the invention in operation.

FIG. 13 shows an enlarged rear view of a portion of one of the rack elements 10 of FIG. 12 with the servers mounted therein. As can be seen in FIG. 13, the power cords from each of the severs is passed through the elongated openings 34 in the side portions 12 (or 14) of the rack element 10, so that the power cords can be connected to a power connector, such as a power strip, housed in the power distribution section 22 of the rack element 10.

The rack elements of the instant invention are designed to enable a pair of rack elements to be used to define a single complete rack system. The equipment can be connected directly to the rack elements using the mounting holes 28 of the front portion 12 of the rack elements (and holes 38 of the rear portion 14 of the rack elements, if desired). Alternatively, the rack accessory disclosed in the above-referenced co-pending application can be installed in the racks prior to installing the equipment thereon. It is noted that FIGS. 11–13 show the rack elements with the rack accessory 52 installed therein for improving the overall functionality of the racking system, as explained in the related co-pending application described above.

As can be seen from the above description, the rack accessory of the present invention significantly improves cooling and power distribution for data centers as compared to conventional racking systems. The rack elements can be made of any suitable material, such as metal. In the preferred form of the invention, the front and rear portions are strong pieces of prefabricated material having the described mounting, ventilation and access holes therein. The remainder of the rack element (i.e., the side portions 12 and 14) can then be constructed of a thinner material, such as sheet metal, and secured to the front and rear portions.

While the preferred forms and embodiment of the present invention have been illustrated and described, various changes and/or modifications may be made without deviating from the true scope of the invention as defined by the appended claims, as one skilled in the art will recognize from the description of the invention herein.

What is claimed is:

1. A rack element for mounting electronic equipment thereon, comprising:

a front portion, a rear portion, and a pair of side portions defining an interior of the rack element therebetween;

said interior of the rack element being partitioned into a front section and rear section, the front section defining an air duct and the rear section defining a power distribution section;

said air duct having an opening at one end thereof for receiving cooling air from an air conditioning system, wherein said front portion of the rack element includes a plurality of openings therein for enabling the cooling air from the duct to exit therethrough;

said power distribution section including an opening at one end thereof for enabling power cables to enter the power distribution section for powering equipment when mounted on the rack element.

2. The rack element of claim 1, wherein the plurality of openings on the front portion of the rack element are substantially equally spaced along substantially the entire front portion of the rack.

3. The rack element of claim 1, wherein the rear portion of the rack includes openings that enable power distribution elements to be inserted into the power distribution section of the rack element.

4. The rack element of claim 2, wherein the rear portion of the rack includes openings that enable power distribution elements to be inserted into the power distribution section of the rack element.

5. The rack element of claim 1, wherein the rack element is configured for use in connection with EIA-spec rack systems.

6. The rack element of claim 4, wherein the rack element is configured for use in connection with EIA-spec rack systems.

7. The rack element of claim 1, further including at least one opening in each of said pair of side portions for enabling mounted equipment power cords to be passed therethrough and into the power distribution section of the rack element.

8. The rack element of claim 6, further including at least one opening in each of said pair of side portions for enabling mounted equipment power cords to be passed therethrough and into the power distribution section of the rack element.

9. The rack element of claim 1, further including a second opening in each of the pair of side portions of the rack element for providing a rear mount location in the power distribution section for mounting side-venting equipment.

10. The rack element of claim 8, further including a second opening in each of the pair of side portions of the rack element for providing a rear mount location in the power distribution section for mounting side-venting equipment.

11. The rack element of claim 1, further including a third opening in each of the pair of side portions of the rack element adjacent a lower end thereof which defines a power distribution channel for distributing power from one rack element to another similar rack element.

12. The rack element of claim 10, further including a third opening in each of the pair of side portions of the rack element adjacent a lower end thereof which defines a power distribution channel for distributing power from one rack element to another similar rack element.

13. A rack element for mounting electronic equipment therein, comprising:

a front portion, a rear portion, and a pair of side portions defining an interior of the rack element therebetween;

said interior of the rack element being partitioned into a front section and rear section, the front section defining an air duct and the rear section defining a power distribution section;

said air duct having an opening at one end thereof for receiving cooling air from an air conditioning system, wherein said front portion of the rack element includes a plurality of openings therein for enabling the cooling air from the duct to exit therethrough;

said power distribution section including an opening at one end thereof for enabling power cables to enter the power distribution section for powering equipment when mounted on the rack element wherein the rack element is adapted for mounting equipment that is one rack unit in height.

14. The rack element of claim 13, wherein a pair of said rack elements define a complete rack for the equipment to be installed thereon.

* * * * *